US005177330A

United States Patent [19]

Takahashi et al.

[11] Patent Number: 5,177,330

[45] Date of Patent: Jan. 5, 1993

[54] KEY BOARD SWITCH

[75] Inventors: Hisamitsu Takahashi; Tatsuo Yamaura; Masao Miyagishima; Takao Kishino, all of Mobara, Japan

[73] Assignee: Futaba Denshi Kogyo K.K., Mobara, Japan

[21] Appl. No.: 730,395

[22] Filed: Jul. 16, 1991

Related U.S. Application Data

[63] Continuation of Ser. No. 407,592, Sep. 15, 1989, abandoned.

[30] Foreign Application Priority Data

Sep. 19, 1988 [JP] Japan ........................ 63-232550

[51] Int. Cl.$^5$ .................... H01H 13/70; H03K 17/94; H04M 11/00

[52] U.S. Cl. .................................... 200/5 A; 200/512; 341/22; 341/25

[58] Field of Search ....................... 200/5 A, 512-517, 200/292; 341/22, 24, 25; 357/51, 59, 67, 71

[56] References Cited

U.S. PATENT DOCUMENTS

| | | | |
|---|---|---|---|
| 3,860,771 | 1/1975 | Lynn et al. | 200/5 A |
| 4,499,557 | 2/1985 | Holmberg et al. | 365/163 |
| 4,568,918 | 2/1986 | Edel | 200/5 A X |
| 4,701,579 | 10/1987 | Kurachi et al. | 200/5 A |

FOREIGN PATENT DOCUMENTS 60-39718 3/1985 Japan .

*Primary Examiner*—J. R. Scott

*Attorney, Agent, or Firm*—Oblon, Spivak, McClelland, Maier & Neustadt

[57] ABSTRACT

A key board switch capable of permitting all key switches to exhibit an N-key rollover function at a low cost while preventing an increase in thickness of the key board switch. For this purpose, a thin film diode is used for a contact of the key switch. The thin film diode may form at least one of the contacts of each of the key switches. Alternatively, the thin film diode may be connected in series to at least one of the contacts of each of the key switches. Alternatively, the thin film diode may be connected in series to at least one of the contacts of each of the key switches.

11 Claims, 4 Drawing Sheets

KEY BOARD SWITCH

This application is a continuation of application Ser. No. 07/407.592, filed on Sep. 15, 1989, now abandoned.

BACKGROUND OF THE INVENTION

This invention relates to a key board switch suitable for use for a computer, a type writer, a word processor and the like, and more particularly to a key board switch in which key switches constituting the key board switch each are provided with a thin film diode, resulting in exhibiting an N-key rollover function.

Conventionally, a key board switch of a key matrix structure, as shown in FIG. 5, is so constructed that a matrix is constituted by a plurality of drive lines D0, D1,—and a plurality of sense lines S0, S1,—and key switches A, B, C, D,—each are arranged in proximity to each intersection between the both lines. A voltage is applied through resistors 31 to each sense line. The ON and Off states of each of the key switches are judged by detecting a variation in voltage of each of the sense lines S0, S1,—caused when the drive lines D0, D1,—are scanned.

In the key board switch constructed as described above, when the key switch B is checked using the drive line D1 and sense line S0 while the key switches A, C and D are concurrently pushed, the key switch B is judged to be open although it is pushed because a current deflectingly flows through the key switches A, C and D as indicated at an arrow in FIG. 5.

In view of the foregoing, in the conventional key board switch, the key switches A, B, C and D each are connected thereto a diode in series to prevent such deflecting flow of a current as described above. In the art, this is called an N-key rollover function.

Diodes used for providing the key board switch with the N-key rollover function are independent from the key switches. Thus, the conventional key board switch has the following disadvantages.

First, when each of the key switches constituting the key board switch comprises a mechanical switch, it is required to mount the diode on a printed circuit board or PCB constituting a part of the mechanical switch, resulting in increasing the thickness of the PCB to a degree sufficient to cause the PCB to be unsuitable for a thin-type key board switch.

Also, the key board switch generally includes about one hundred key switches, resulting in requiring diodes corresponding in number to the key switches. This renders the assembling of the key board switch highly troublesome.

Further, when each of the key switches constituting the key board switch comprises a membrane switch, it is impossible to arrange a diode of a large thickness on the membrane switch in a manner to correspond to each of contacts of a flexible printed circuit board because the membrane switch has a small thickness. In view of such a difficulty, it is practiced that each of the diodes is provided on a separate substrate and connected through a wiring to each of the contacts on the flexible printed circuit board. Unfortunately, such construction causes the arrangement of the wiring on the flexible printed circuit board for the connection to the separate substrate to be highly complicated and the thickness of the whole key board switch in which the separate substrate and membrane switch are integrated with each other to be substantially increased.

SUMMARY OF THE INVENTION

The present invention has been made in view of the foregoing disadvantages of the prior art.

Accordingly, it is an object of the present invention to provide a key board switch which is capable of providing all key switches with an N-key rollover function at a low cost.

It is another object of the present invention to provide a key board switch which is capable of exhibiting satisfactory endurance.

It is a further object of the present invention to provide a key board switch which is capable of being significantly thin-walled.

In accordance with the present invention, a key board switch is provided which comprises a plurality of key switches each including two or more contacts. At least one of the contacts of each of the key switches comprises a thin film diode.

Also, in accordance with the present invention, a key board switch is provided which comprises a plurality of key switches each including two or more contacts and a thin film diode connected in series to at least one of the contacts of each of the key switches.

In the present invention, the key switch may comprise a membrane switch or a mechanical switch including a printed circuit board on which at least one contact is provided.

In the key board switch of the present invention constructed as described above, the thin film diode is used for providing the key switches with an N-key rollover function. Such construction permits a diode to be readily provided at each of the key switches while preventing an increase in thickness of the key board switch.

BRIEF DESCRIPTION OF THE DRAWINGS

These and other objects and many of the attendant advantages of the present invention will be readily appreciated as the same becomes better understood by reference to the following detailed description when considered in connection with the accompanying drawings in which like reference numerals designate like or corresponding parts throughout; wherein.

DETAILED DESCRIPTION OF THE PREFERRED EMBODIMENTS

Now, a key board switch according to the present invention will be described hereinafter with reference to the accompanying drawings.

Figure 1:
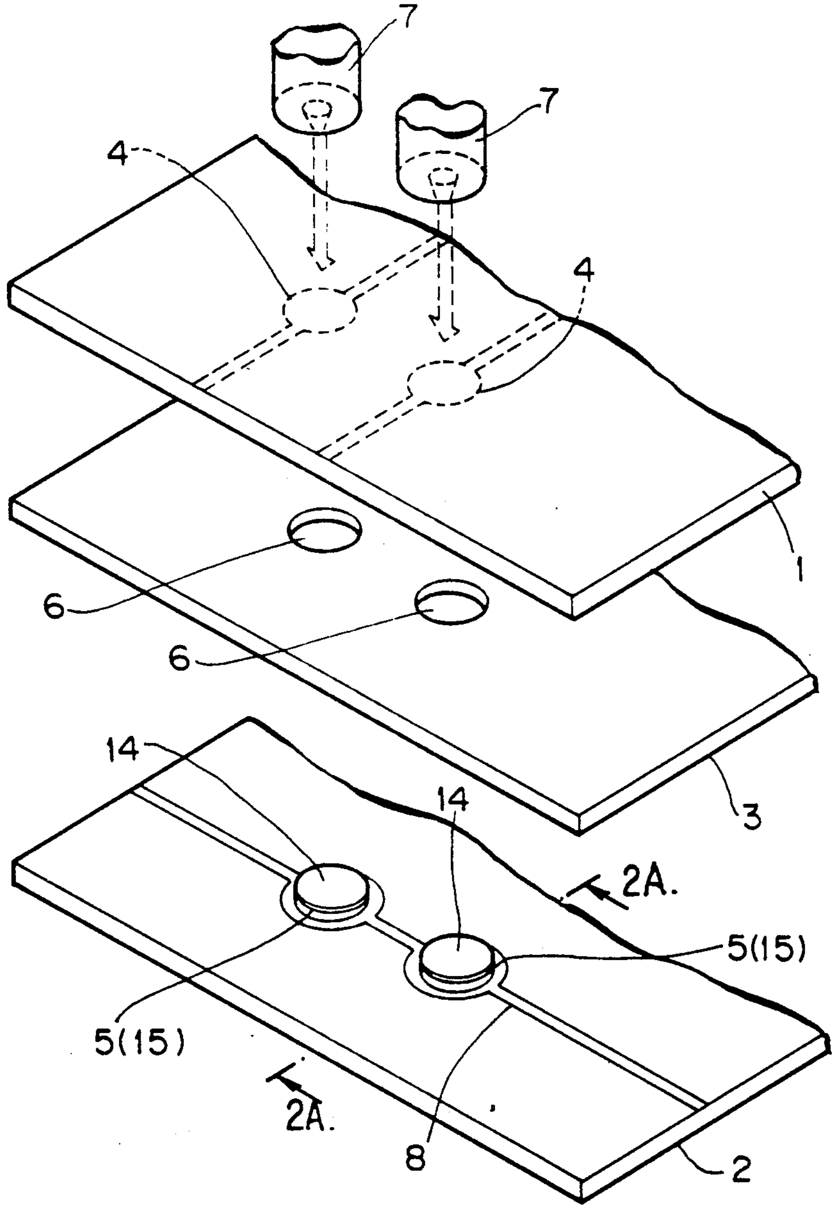
FIG. 1 is an exploded perspective view showing an embodiment of a key board switch according to the present invention.
Figure 2A:
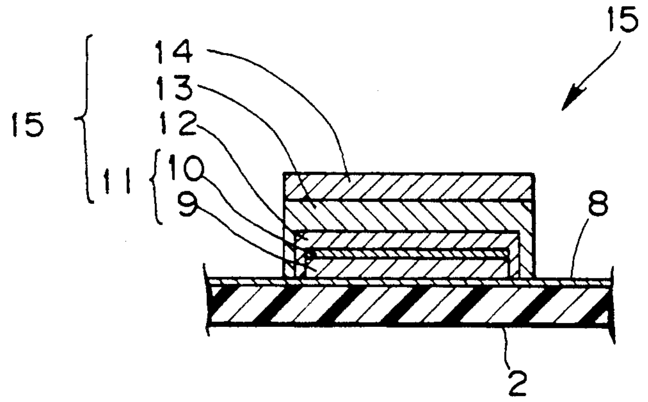
FIG. 2A is an enlarged sectional view taken along line A—A of FIG. 1.

FIG. 1 is an exploded perspective view showing an embodiment of a key board switch according to the present invention and FIGS. 2A is an enlarged sectional view showing an essential part of the key board switch shown in FIG. 1. In a key board switch of the illustrated embodiment, a membrane switch is used for each of key switches constituting the key board switch. The membrane switch, as shown in FIG. 1, includes an upper film 1 and a lower film 2 which are formed of a plastic material such as polyester or the like and integrally connected to each other through an insulating spacer 3. The upper film 1 is formed on the lower surface thereof with contacts 4 and the lower film 2 is formed on the upper surface thereof with contacts 5. The contacts 4 and 5 are arranged opposite to each other through holes 6 formed through the spacer 3. Above the upper film 1 are key stems 7 for keys provided at the key board switch in a manner to correspond to the contacts 4 and 5, so that the contacts 4 and 5 may be forcedly pressed against each other when the key stems 7 are pushed down. Thus, the key switches are provided.

In the illustrated embodiment, the contact 5 which is one of the contacts of the membrane switch constituting the key switch comprises a thin film diode 15 of the p-n junction type formed of an organic thin film. More particularly, as shown in FIG. 2A, the lower film 2 is formed on the upper surface thereof with an aluminum wiring 8, on which an electrode 11 comprising an Ni layer 9 and an Au layer 10 is arranged. A Pt layer may be substituted for the Au layer 10. The electrode 11 is covered with a p-type layer 12 formed of, for example, polypyrrole, and the p-type layer 12 is covered with an n-type layer 13 formed of, for example, polythiophene. The n-type layer 13 is provided on the upper surface thereof with an electrode 14 formed of In, Al, graphite or the like.

Now, the manufacturing of the thin film diode 15 incorporated in the embodiment will be described.

(1) Formation of Aluminum Wiring

The aluminum wiring 8 is formed, by photolithography, on the lower film 2 of the membrane switch formed of polyester.

(2) Covering With Resist

Then, the remaining part of the aluminum wiring 8 other than the portion on which the electrode 11 is to be formed is covered with a resist.

(3) Formation of Electrode

Subsequently, the portion of the aluminum wiring 8 which is not covered with the resist is formed thereon with the Ni layer 9 and Au layer 10 by plating.

(4) Formation of P-type Layer

Figure 4:
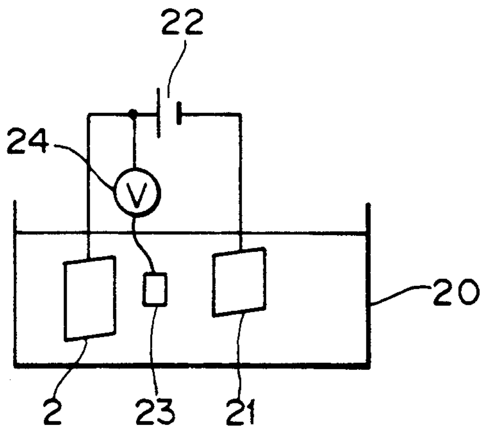
FIG. 4 is a schematic view showing the manufacturing of a thin film diode used in each of the embodiments shown in FIGS. 1 and 3.

Thereafter, the p-type layer 12 is formed. More particularly, as shown in FIG. 4, 0.1 mol of pyrrole and 0.1 mol of $Et_4NPF_6$ (tetraethyleneammonium hexafluorophosphate) acting as a supporting electrolyte are dissolved in an acetonitrile solvent in an electrolytic cell 20, resulting in a solution. Then, in the so-prepared solution are immersed the lower film 2 functioning as a work electrode and a Pt plate 21 acting as a counterelectrode, which are then electrically connected to a power supply 22 so that the lower film 2 and Pt plate 21 may serve as a negative electrode and a positive electrode, respectively, resulting in carrying out electrolytic polymerization. This causes a polypyrrole layer to be formed on the electrode 11 of the lower film 2. The voltage and charge may be set at, for example, 1.0 $V_{dc}$ and 0.5 coulomb/$cm^2$, respectively. In FIG. 4, reference numeral 23 designates a reference electrode connected to a voltmeter 24.

(5) Washing

Then, a washing operation is carried out. More particularly, the lower film 2 on which the p-type layer 12 is thus formed is fully washed with acetonitrile and nitromethane.

(6) Doping

The lower film 2 is immersed in a solution prepared by dissolving 0.1 mol of $Me_4NPF_6$ (tetramethylammonium hexafluorophosphate) acting as a supporting electrolyte in an acetonitrile solvent. The lower film 2 is connected to the positive electrode of a power supply and a counterelectrode is connected to the negative electrode of the power supply, so that the lower film 2 is subject to a doping treatment for one minute in the solution. This causes $PF_6^-$ (hexafluorophosphate anion) to be doped into the p-type layer 12.

(7) Formation of N-type Layer 0.1 mol of thiophene and 0.1 mol $E_{t4}NBF_4$ (tetraethyleammonium terafluoroborate) are dissolved in a nitromethane solvent, to thereby prepare a solution. Then, electrolytic polymerization is carried out in the solution in such a manner as described above with reference to FIG. 4, so that a polythiophene layer acting as the n-type layer 13 is formed on the p-type layer 12 described above. In the treatment, a voltage applied to the electrode 11 of the lower film 2 is +1.8 $V_{dc}$ higher than the voltage applied in the step (4) described above.

(8) Washing

The step (5) described above is repeated.

(9) Doping

The lower film 2 on which the p-type layer 12 and n-type layer 13 are formed is applied thereto a voltage of −2.0 V for five minutes under the same conditions as in the step (3) described above, leading to the doping of the cation contained in the supporting electrolyte into the n-type layer 13.

(10) Drying

The lower film 2 is subject to vacuum drying.

(11) Formation of Electrode

The electrode 14 is formed on the n-type layer 13. Al, In, Au, Pt, Ni, graphite or the like may be used for the electrode 14. Alternatively, it may be formed of an ITO (indium-tin oxide) film or stainless steel. When the electrode 14 is formed into a shape of a thick film, printing such as screen printing or the like may be used. The electrode in the form of a thin film may be formed by vapor deposition or spattering.

Now, materials for the p-type layer 12, n-type layer 13, supporting electrolyte and solvent will be described.

(a) P-type Layer

Materials for the p-type layer 12 may include electrolytic-oxidative-polymerizable conductive polymers such as polypyrrole, polyfuran, polyselenophene, polytellurophene, poly-N-methylpyrrole, poly-N-alkylpyrrole, polyaniline, polyparaphenylene, polythiazyl, polynaphthylene, polyanthracene-3-alkylthiophene and the like.

(b) N-type Layer

Materials for the n-type layer 13 include polythiophene, poly-3-alkylthiophene and poly-1,2-dithienylethene.

(c) Supporting Electrolyte

Material for the supporting electrolyte include tetramethylammonium perchlorate, tetraethylammonium perchlorate, tetrabutylammonium perchlorate, lithium perchlorate, tetramethylammonium tetrafluoroborate.

tetraethylammonium tetrafluoroborate, tetrabutylammonium tetrafluoroborate, lithium tetrafluoroborate, tetramethylammonium hexafluoroarsenate, tetrabutylammonium hexafluoroarsenate, tetramethylammonium hexafluorophosphate, tetrabutylammonium hexafluorophosphate, sodium hexafluorophosphate, sulfuric acid, tetramethylammonium bisulfate, tetraethylammonium bisulfate, tetrabutylammonium bisulfate, sodium trifluoroacetate, tetramethylammonium p-toluenesufonate and tetrabutylammonium p-toluenesulfonate.

(d) Solvent

The solvent includes acetonitrile, benzonitrile, nitrobenzene, propylene carbonate, methylene chloride, tetrahydrofuran, dimethylformamide, dimethyl sulfoxide and water.

As can be seen from the foregoing, the above-described embodiment permits each of the membrane switches constituting the key board switch to be provided with the thin film diode 15 according to the sequential steps. Accordingly, the embodiment permits the key board switch including the membrane switches to exhibit an N-key rollover function at a low cost without deteriorating the thin-walled characteristics of the key board switch. In each of the membrane switches used for the key board switch, the upper and lower films on which the contacts are provided each are generally made of an insulating synthetic resin material such as polyester or the like. Such a synthetic resin material fails to exhibit good heat-resistance, accordingly, the formation of the thin film diode is preferably carried out at a temperature as low as possible. In general, the formation of the thin film diode by an inorganic material requires a high temperature. However, the illustrated embodiment uses an organic material which permits the formation of a diode to be carried out at a low temperature, so that the formation may be accomplished without damaging the films of the membrane switch.

In the embodiment described above, the thin film diode 15 is provided on the lower film 2 of the membrane switch. However, the contacts 4 on the upper film 1 each may comprise a thin film diode.

Both upper and lower contacts 4 and 5 may comprise the thin film diode. This prevents the damage of one of the thin film diodes from interfering with the N-key rollover function.

Figure 3:
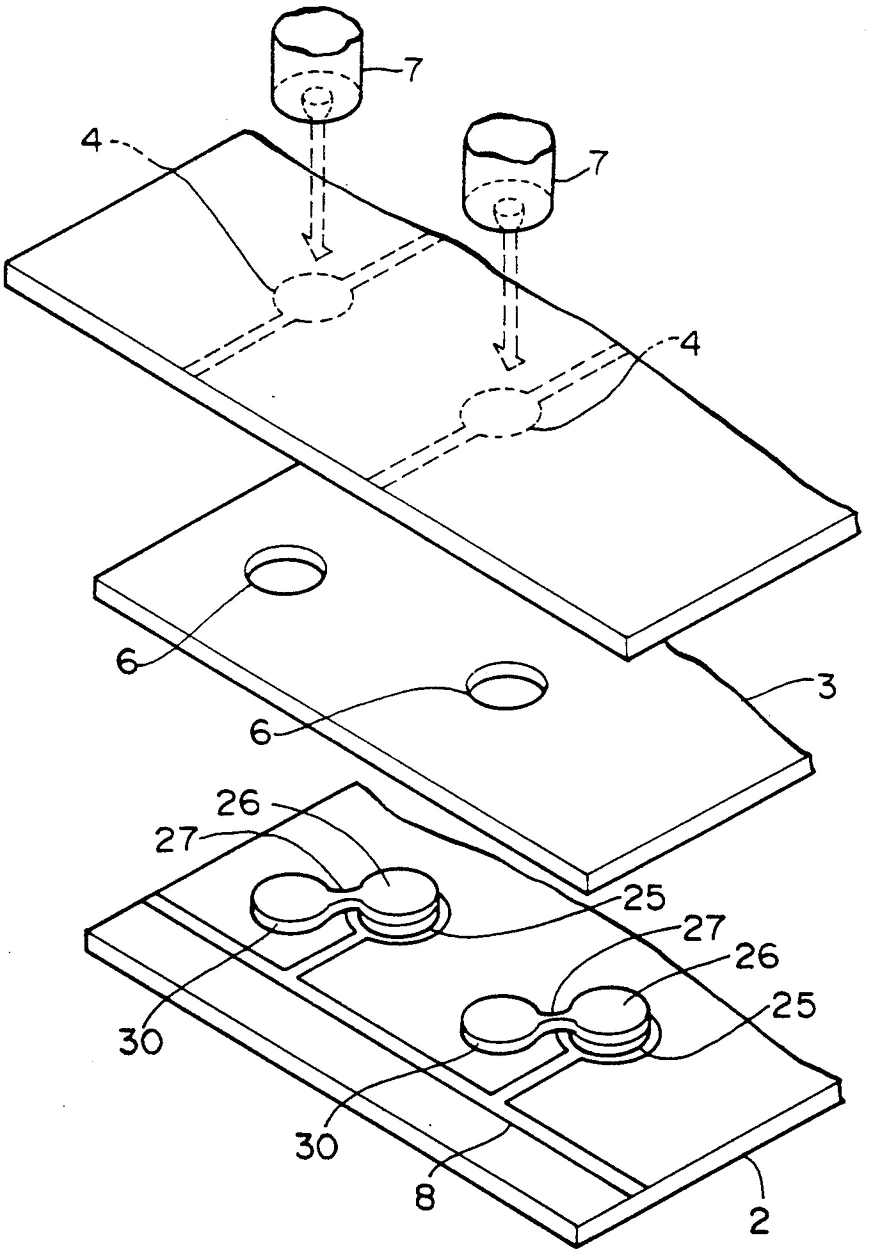
FIG. 3 is an exploded perspective view showing another embodiment of a key board switch according to the present invention.
Figure 5:
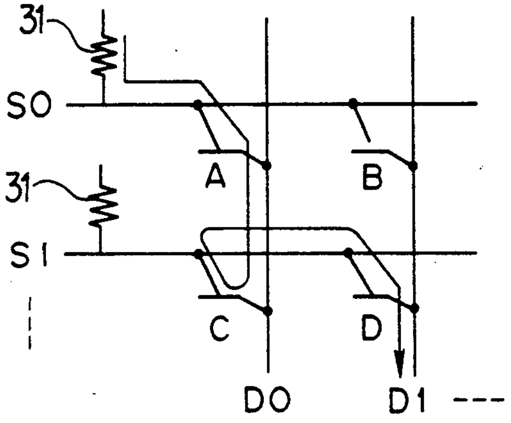
FIG. 5 PRIOR ART
FIG. 5 is a circuit diagram showing a matrix structure of a key board switch and the deflecting flow of a current through the matrix structure.
Figure 6:
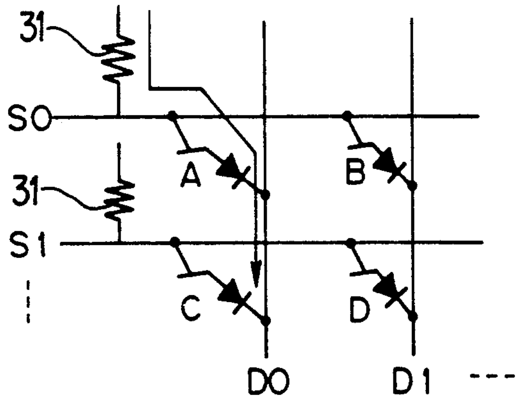
FIG. 6 is a circuit diagram showing a key board switch including key boards each having a diode incorporated therein.

FIG. 3 shows another embodiment of a key board switch according to the present invention. In a key board switch of the illustrated embodiment, a membrane switch is used for a key switch. As shown in FIG. 3, the membrane switch includes a lower film 2, which is provided thereon with contacts 30. Also, the lower film 2 is provided thereon with thin film diodes 25 in a manner to be adjacent to the respective contacts 30. The thin film diodes 25 each are electrically connected to an aluminum wiring 8 provided on the lower film 2 and an electrode 26 of each of the diodes 25 is connected through a conductor 27 to the corresponding contact 30. Thus, in the illustrated embodiment, the thin film diodes 25 are connected in series between the contacts 30 of the membrane switch and the aluminum wiring 8. Such construction prevents any pressing force from being applied to the thin film diodes 25 when contacts 4 and the contacts 30 are forcedly contacted with each other for closing the switch, so that the key board switch of the illustrated embodiment is hard to be broken to a degree sufficient to exhibit good endurance, as compared with the embodiment described above. The remaining part of the illustrated embodiment may be constructed in substantially the same manner as the embodiment described above.

In each of the embodiments described above, the membrane switch is used for each of the key switches for the key board switch. However, a further embodiment of the present invention may be so constructed that a mechanical switch having at least one of contacts provided on a printed circuit board may be used as each of key switches. In this embodiment, the key board switch may be constructed, for example, in such a manner that a thin film diode formed on the printed circuit board is used as a fixed contact and a movable contact is contacted with the thin film diode. Alternatively, as in the embodiment shown in FIG. 3, the thin film diode may be connected in series to the fixed contact.

Also, still another embodiment of the present invention may be so constructed that a thin film diode may be provided on a circuit pattern of a printed circuit board on which contacts for mechanical switches are arranged.

In the embodiments described above, the thin film diode is of the p-n junction type. However, in the illustrated embodiment, a thin film diode of the schottky barrier type is used for the purpose.

In the embodiment, a membrane switch may be constructed in substantially the same manner as in the embodiments shown in FIGS. 1 and 3.

Figure 2B:
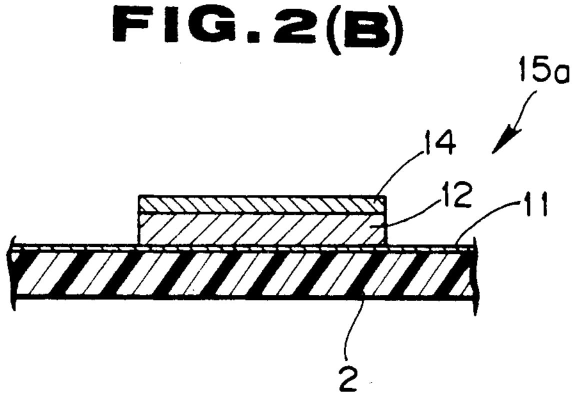
FIG. 2B is an enlarged sectional view showing a thin film diode of the schottky barrier type.

Now, a thin film diode of the schottky barrier type 15*a* will described hereinafter. As shown in FIG. 2B, an ITO film is arranged on an upper surface of a lower film 2 formed of a polyester film to provide an lower electrode 11 acting also as a wiring. On the lower electrode 11 is arranged a p-type semiconductor layer 12 made of poly-3-methylthiophene, on which an upper electrode 14 made of In, Al or the like is contactedly arranged to form a schottky junction.

The so-constructed thin film diode of the schottky barrier type may be manufactured according to the following procedure.

(1) Formation of Lower Electrode

First, the lower electrode 11 acting also as the wiring is formed of ITO on the lower film 2 of the membrane switch made of a polyester film by photolithography. The lower electrode 11 is made of a conductive material which includes Al, Au, Ag and the like in addition to the above-described ITO. The material for the lower electrode 11 is not limited to any specific material so long as it may carry out the ohmic contact with the p-type semiconductor 12.

(2) Formation of P-type Later

The remaining part of the lower film other than the portion on which the lower electrode 11 is arranged is covered with a resist. Then, as shown in FIG. 4, 0.1 to 0.5 mol/l of 3-methylthiophene monomer and 0.01 to 0.5 mol/l of $Et_4NPF_6$ (tetraethyleammonium hexafluorophosphate) serving as a supporting electrolyte are dissolved in a suitable solvent such as propylene carbonate, nitromethane or the like, resulting in a solution. In the so-prepared solution are immersed the lower film 2 acting as a work electrode and a Pt plate 21 acting as a counter electrode. Subsequently, the lower film 2 and Pt plate 21 are connected to a power supply 22 so as to function as a negative electrode and a positive electrode, respectively, resulting in electrolytic polymerization being carried out. This causes a layer of poly-3-methylthiophene to be formed on the electrode 11 of the lower film 2, leading to the p-type layer 12. The electrolytic polymerization may be conducted at a voltage of 10-50 Vdc, a current density of 10 $mA/cm^2$ and a temperature of $0^\circ$-$25^\circ$ C.

(3) Washing

The lower film 2 on which the p-type later 12 is thus formed is then fully washed with acetonitrile and nitromethane.

(4) Doping 0.01 to 0.5 mol/l of $Et_4NPF_6$ (tetraethyleammonium hexafluorophosphate) serving as a supporting electrolyte is dissolved in a suitable solvent such as propylene carbonate, nitromethane or the like, resulting in a solution, in which the lower film 2 is immersed. Then, the lower film 2 and a counter electrode are connected to positive and negative electrodes of a power supply, respectively, and then it is subject to a doping treatment at a voltage of about 1.4 V for one minute, resulting in the p-type layer 12 being doped with $PF_6^-$ (hexafluorophosphate anion).

(5) Drying

The lower film is then subject to drying.

(6) Formation of Electrode

The upper electrode 14 is formed on the p-type layer 12. It may be depositedly made of In, Al or the like by vapor deposition or sputtering.

The illustrated embodiment uses the p-type layer 12 for the semiconductor. However, for this purpose, the thin film diode of the schottky barrier type may be used which is formed by using Au, Pt, Ag, Cu or the like for the upper electrode while substituting the n-type layer described above for the p-type layer, to thereby form a schottky junction.

As can be seen from the foregoing, in the present invention, at least one of contacts of each of the key switches constituting the key board switch is formed using the thin film diode. Thus, all key switches for the key board switch may be provided with an N-key roll-over function at a low cost.

Also, the present invention may be so constructed that the thin film diode is connected in series to at least one of the contacts of the key switch. Such construction permit the key board switch to exhibit good endurance as compared with the case that the thin film diode itself constitutes the contact.

Further, the application of such construction of the present invention to a mechanical switch significantly decreases the thickness of a key board switch of the mechanical switch type which is conventionally thick-walled because of the mounting of an independent diode thereon.

Moreover, the application of the construction to a membrane switch provides a key board switch of the membrane switch type which exhibits an N-key roll-over function.

While preferred embodiments of the invention have been described with a certain degree of particularity with reference to the drawings, obvious modifications and variations are possible in the light of the above teachings. It is therefore to be understood that within the scope of the appended claims, the invention may be practiced otherwise than as specifically described.

What is claimed is:

1. A key switch comprising:
   a key stem connected to a key;
   a first contact means mounted on a first film and being in electrical contact with a first line;
   a second contact means mounted on a second film and being in electrical contact with a second line;
   at least one of said first and second films being formed of a flexible deformable elastomeric sheet material;
   said key stem, said first contact means and said second contact means being aligned so that an actuation of said key causes said first and second contact means to be in electrical contact and said first and second lines to be electrically connected;
   at least one of said first and second contact means being formed of a conductive electrode and a contiguous thin film organic type diode electrically connected in series and integrally formed within said key switch.

2. A key switch according to claim 1, wherein said first and second films are separated by an insulator.

3. A key switch according to claim 2, wherein said insulator has a hole aligned with said first and second contact means.

4. A key switch according to claim 1, wherein said thin film diode is a p-n junction type.

5. A key switch according to claim 1, wherein said thin film diode is a Schottky barrier type.

6. A key switch according to claim 1, wherein said conductive electrode is mounted on said thin film diode.

7. A key switch according to claim 1, wherein said thin film diode and said conductive electrode are both mounted side-by-side on the same one of said first and second film.

8. A key switch according to claim 1, wherein said first and second lines are drive lines and sense lines.

9. A key switch according to claim 1, wherein said key switch is a membrane switch.

10. A key board having a plurality of key switches, each of said key switches comprising:
    a key stem connected to a key;
    a first contact means mounted on a first film and being in electrical contact with a first line;
    a second contact means mounted on a second film and being in electrical contact with a second line;
    at least one of said first and second films being formed of a flexible deformable elastomeric sheet material;
    said key stem, said first contact means and said second contact means being aligned so that an actuation of said key causes said first and second contact means to be in electrical contact and said first and second lines to be electrically connected;
    at least one of said first and second contact means being formed of a conductive electrode and a contiguous thin film organic-type diode electrically connected in series.

11. A key board according to claim 10, wherein said key switches are arranged in rows and columns with the first contact means of all key switches in each row connected to the same first line, and with the second contact means of all key switches in each column being connected to the same second line.

* * * * *